(12) United States Patent
Chen et al.

(10) Patent No.: US 8,946,012 B2
(45) Date of Patent: *Feb. 3, 2015

(54) METHOD OF FORMING A SEMICONDUCTOR STRUCTURE

(71) Applicant: Taiwan Semiconductor Manufacturing Company, Ltd., Hsinchu (TW)

(72) Inventors: Po-Chih Chen, Hsinchu (TW); Jiun-Lei Jerry Yu, Zhudong Township (TW); Fu-Wei Yao, Hsinchu (TW); Chun-Wei Hsu, Taichung (TW); Fu-Chih Yang, Fengshan (TW); Chun Lin Tsai, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/200,777

(22) Filed: Mar. 7, 2014

(65) Prior Publication Data
US 2014/0187002 A1    Jul. 3, 2014

Related U.S. Application Data

(63) Continuation of application No. 13/233,356, filed on Sep. 15, 2011, now Pat. No. 8,697,505.

(51) Int. Cl.
*H01L 21/338*    (2006.01)
*H01L 29/66*    (2006.01)
*H01L 29/778*    (2006.01)
*H01L 29/20*    (2006.01)

(52) U.S. Cl.
CPC ...... *H01L 29/66462* (2013.01); *H01L 29/7787* (2013.01); *H01L 29/2003* (2013.01)

USPC .......................................... 438/167; 438/605

(58) Field of Classification Search
CPC ........................... H01L 29/205; H01L 29/201
USPC .......... 438/317, 312, 167, 603, 605; 257/187, 257/E21.539, E21.482, E21.249
See application file for complete search history.

(56) References Cited

U.S. PATENT DOCUMENTS 6,410,460 B1    6/2002    Shalish et al.
8,697,505 B2 *  4/2014    Chen et al. .................... 438/167
(Continued)

FOREIGN PATENT DOCUMENTS

JE    2001-015452 A * 1/2001 ............... H01L 21/28

*Primary Examiner* — Caridad Everhart
(74) *Attorney, Agent, or Firm* — Lowe Hauptman & Ham, LLP

(57) ABSTRACT

A method of forming a semiconductor structure having a substrate is disclosed. The semiconductor structure includes a first layer formed in contact with the substrate. The first layer made of a first III-V semiconductor material selected from GaN, GaAs and InP. A second layer is formed on the first layer. The second layer made of a second III-V semiconductor material selected from AlGaN, AlGaAs and AlInP. An interface is between the first layer and the second layer forms a carrier channel. An insulating layer is formed on the second layer. Portions of the insulating layer and the second layer are removed to expose a top surface of the first layer. A metal feature is formed in contact with the carrier channel and the metal feature is annealed to form a corresponding intermetallic compound.

20 Claims, 6 Drawing Sheets

(56) References Cited

U.S. PATENT DOCUMENTS

| | | | |
|---|---|---|---|
| 2001/0001079 A1* | 5/2001 | Teraguchi | 438/603 |
| 2005/0087763 A1 | 4/2005 | Kanda et al. | |
| 2005/0184309 A1 | 8/2005 | Nguyen et al. | |
| 2008/0050855 A1 | 2/2008 | Dwilinski et al. | |
| 2008/0173898 A1 | 7/2008 | Ohmaki | |
| 2009/0042325 A1 | 2/2009 | Fujimoto et al. | |
| 2010/0117118 A1* | 5/2010 | Dabiran et al. | 257/190 |
| 2011/0136305 A1 | 6/2011 | Saxler et al. | |

* cited by examiner

METHOD OF FORMING A SEMICONDUCTOR STRUCTURE

PRIORITY CLAIM

The present application is a continuation of U.S. application Ser. No. 13/233,356, filed Sep. 15, 2011, the disclosure of which is incorporated herein by reference in its entirety.

TECHNICAL FIELD

The disclosure relates generally to a method of making a semiconductor structure and, more particularly, to a method of making a high electron mobility transistor.

BACKGROUND

In semiconductor technology, due to its characteristics, III-V based high electron mobility transistors have a number of attractive properties, including high electron mobility and the ability to transmit signals at high frequency, etc.

However, the III-V based high electron mobility transistors are costly to make by using the traditional III-V processes. For example, the traditional III-V process requires metal formation by evaporation and using ohmic structures containing gold, all of which can be expensive. Therefore, what is needed is to develop a process by which the existing silicon fabrication tools can be used to manufacture III-V based transistors.

BRIEF DESCRIPTION OF THE DRAWINGS

Aspects of the present disclosure are best understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be understood, however, that the disclosure provides many applicable inventive concepts that can be embodied in a wide variety of specific contexts. The specific embodiments discussed are merely illustrative and do not limit the scope of the disclosure.

Figure 1:
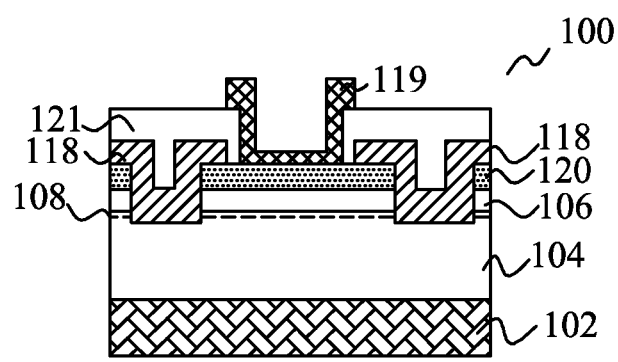
FIG. 1 is a cross-sectional view of a semiconductor structure having a high electron mobility transistor according to some embodiments of this disclosure.
Figure 2:
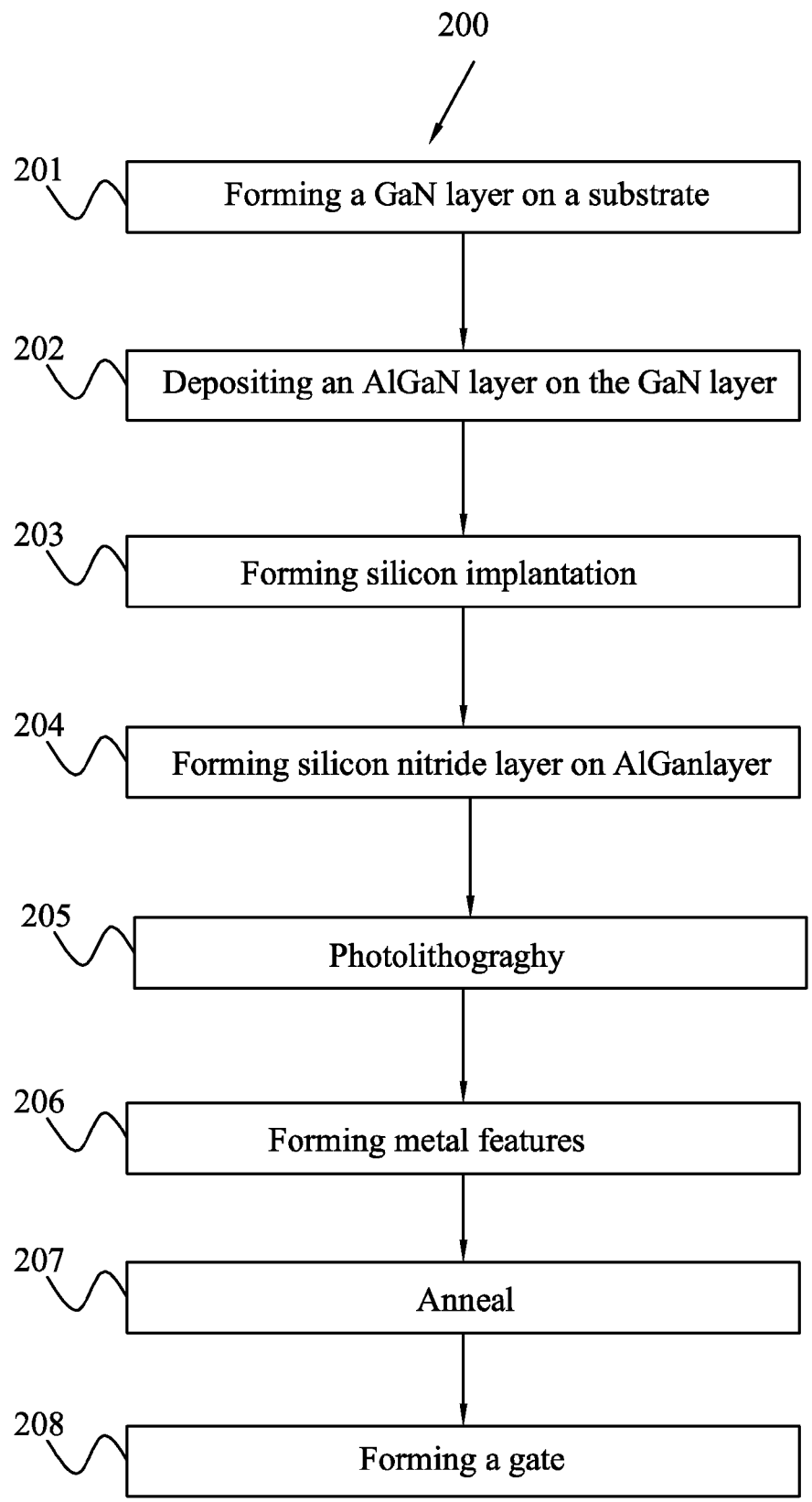
FIG. 2 is a flowchart of a method of forming a semiconductor structure having a high electron mobility transistor according to one or more embodiments of this disclosure.

Illustrated in FIG. 1 is a cross-sectional view of semiconductor structure 100, which reflects at least one embodiment of this disclosure. FIG. 2 is a flowchart of a method 200 of forming a semiconductor structure having a GaN high mobility transistor according to one or more embodiments of this disclosure. FIGS. 3 to 12 are cross-sectional views of forming the semiconductor structure 100 having a GaN high mobility transistor at various stages of manufacture according to some embodiments of the method 200 of FIG. 2. It should be noted that additional processes may be provided before, during, or after the method 200 of FIG. 2. Various figures have been simplified for a better understanding of the inventive concepts of the present disclosure.

Referring to FIG. 1, the semiconductor structure 100 having a GaN high mobility transistor is briefly illustrated. The semiconductor structure 100 includes a substrate 102. The substrate 102 may be a silicon carbide (SiC) substrate, sapphire substrate or a silicon substrate.

The semiconductor structure 100 also includes a heterojunction formed between two different semiconductor material layers, such as material layers with different band gaps. For example, the semiconductor structure 100 includes a non-doped narrow-band gap channel layer and a wide-band gap n-type donor-supply layer. In one embodiment, the semiconductor structure 100 includes a first layer 104 (i.e., a channel layer) formed on the substrate 102 and a second layer 106 (i.e., a donor-supply layer) formed on the channel layer 104. Generally, the channel layer 104 and the donor-supply layer 106 are different from each other in composition, such as in this case. The channel layer 104 is undoped or unintentionally doped (UID). In the present example of the semiconductor structure 100, the channel layer 104 includes a gallium nitride (GaN) layer (also referred to as the GaN layer 104). The donor-supply layer 106 includes an aluminum gallium nitride (AlGaN) layer (also referred to as AlGaN layer 106). In this embodiment, the GaN layer 104 and AlGaN layer 106 are in direct contact with each other. In another example, the channel layer 104 includes a GaAs layer or InP layer. The donor-supply layer 106 includes an AlGaAs layer or an AlInP layer.

In some embodiments, the GaN layer 104 is undoped. Alternatively, the GaN layer 104 is unintentionally doped, such as lightly doped with n-type impurities due to a precursor used to form the GaN layer 104. In one example, the GaN layer 104 has a thickness in a range between about 0.5 microns and about 10 microns. In another example, the GaN layer 104 has a thickness of about 2 microns.

In some embodiments, the AlGaN layer 106 is intentionally doped. In one example, the AlGaN layer 106 has a thickness in a range between about 5 nanometers and about 50 nanometers. In another example, the AlGaN layer 106 has a thickness of about 15 nanometers.

The electrons from a piezoelectric effect in the AlGaN layer 106 drop into the GaN layer 104, creating a very thin layer 108 of highly mobile conducting electrons in the GaN layer 104. This thin layer 108 is referred to as a two-dimensional electron gas (2-DEG), forming a carrier channel (also referred to as the carrier channel 108). The thin layer 108 of 2-DEG is located at an interface of the AlGaN layer 106 and the GaN layer 104. Thus, the carrier channel has high electron mobility because the GaN layer 104 is undoped or unintentionally doped, and the electrons can move freely without collisions with the impurities or with substantially reduced collisions.

The semiconductor structure 100 also includes a source feature and a drain feature disposed on the AlGaN layer 106 and configured to electrically connect to the carrier channel 108. Each of the source feature and the drain feature comprises a corresponding intermetallic compound 118. In this embodiment, the intermetallic compound 118 goes through the AlGaN layer 106 and sinks into the GaN layer 104. In one example, the intermetallic compound 118 is free of Au and comprises Al, Ti, or Cu. In another example, the intermetallic compound 118 is free of Au and comprises AN, TiN, $Al_3Ti$ or $AlTi_2N$.

The semiconductor structure 100 also includes a gate 119 disposed on the AlGaN layer 106 between the source and
} drain features 118. The gate 119 includes a conductive material layer which functions as the gate electrode configured for voltage bias and electrical coupling with the carrier channel 108. In various examples, the conductive material layer may include a refractory metal or its compounds, e.g., tungsten (W), titanium nitride (TiN) and tantalum (Ta). In one example, the gate 119 is directly disposed on the AlGaN layer 106. In another example, a dielectric layer, such as a silicon nitride layer 120, is formed between the gate 119 and the AlGaN layer 106. The dielectric layer may also be made from include silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$) or hafnium oxide ($HfO_2$). The dielectric layer has a thickness in a range between about 3 nm and about 100 nm. The dielectric layer provides isolation to prevent gate leakage and further improve device-switching speed.

The semiconductor structure 100 also includes a dielectric layer 121 (also known as a dielectric-capping layer) disposed over gate 119 and the source/drain features (namely the intermetallic compounds 118). The dielectric-capping layer 121 covers the source/drain features and exposes a portion of the source/drain features to form functional circuitry. The gate 119 is at least partially embedded in the dielectric-capping layer 121. The dielectric-capping layer 121 can be made from silicon nitride.

In the above described embodiments, the gate 119, the source/drain features, and the carrier channel 108 in the GaN layer 104 are configured as an enhancement-mode transistor, where when a positive voltage applied to the gate stack for forward bias is great enough, the enhancement-mode (E-mode) transistor is turned on.

Now we will describe the process that makes the semiconductor structure depicted in FIG. 100 and described above.

Referring now to FIG. 2 the flowchart of the method 200, at operation 201, a GaN layer is formed on a substrate. Next, the method 200 continues with operation 202 in which an AlGaN layer is deposited on the GaN layer.

Figure 3:
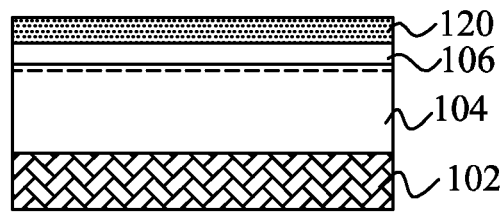
FIGS. 3 to 12 are cross-sectional views of forming a semiconductor structure having a high electron mobility transistor at various stages of manufacture according to some embodiments of the method of FIG. 2.

FIG. 3 is an enlarged cross-sectional view of a portion of a substrate 102 of a semiconductor structure 100 after performing operations 201 and 202. The substrate 102 may be a silicon carbide (SiC) substrate, sapphire substrate or a silicon substrate. A layer 104, also refer to as a channel layer, is grown on the substrate 102. In this embodiment, the layer 104 refers to a gallium nitride (GaN) layer (also referred to as the GaN layer 104). The GaN layer 104 can be epitaxially grown by metal organic vapor phase epitaxy (MOVPE) using a gallium-containing precursor and a nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. In one embodiment, the GaN layer 104 has a thickness in a range between about 0.5 microns and about 10 microns.

A second layer 106, also refer to as donor-supply layer, is grown on the GaN layer 104. An interface is between the GaN layer 104 and the AlGaN layer 106. A carrier channel 108 of 2-DEG is located at the interface. In this embodiment, the AlGaN layer 106 can be epitaxially grown on the GaN layer 104 by MOVPE using an aluminum-containing precursor, a gallium-containing precursor, and a nitrogen-containing precursor. The aluminum-containing precursor includes TMA, TEA, or other suitable chemical(s). The gallium-containing precursor includes TMG, TEG, or other suitable chemical(s). The nitrogen-containing precursor includes ammonia, TBAm, phenyl hydrazine, or other suitable chemical(s). The AlGaN layer 106 has a thickness in a range between about 5 nanometers and about 50 nanometers. In other embodiments, the AlGaN layer 106 may include an AlGaAs layer, or an AlInP layer.

Next back to FIG. 2, method 200 continues with operation 203, in which silicon implantations are formed underneath the silicon nitride insulating layer 120, in the source and drain regions. Specifically, a photoresist layer is deposited on the AlGaN layer 106. Thereafter, a photolithographic and subsequent etching process takes place to make two openings in the photoresist layer, exposing the AlGaN layer 106 where the silicon implantation will take place. Finally ion implantation takes place to create Si-implanted regions.

Next, in accordance to FIG. 2, method 200 continues with the next steps 204, in which a silicon nitride layer 120 is deposited on the AlGaN layer 106. Then in operation 205, parts of the surface of the LPSN layer 120 are exposed via photolithography.

Figure 4:
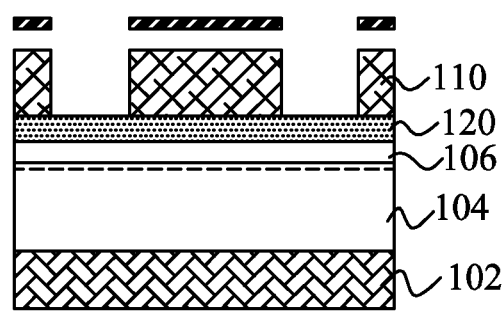

FIG. 4 is a cross-sectional view of the structure 100 after the performance of operation 205. A mask layer 109 is formed on a top surface of the silicon nitride layer 120 and exposes two openings on the surface of the silicon nitride layer 120. The masking layer 110 may be a hardmask comprising silicon nitride or a photo resist. Once formed, the masking layer 110 is patterned through suitable photolithographic and etching processes to form the openings and expose those portions of the top surface of the silicon nitride layer 120.

Figure 5:
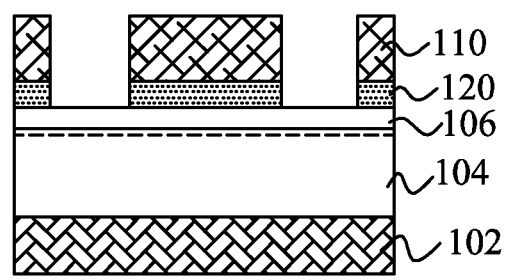

Next, as FIG. 5 shows, the exposed portions of the silicon nitride layer 120 through the openings are completely removed by a suitable process such as reactive ion etching (RIE), thus exposing portions of the AlGaN layer 106 directly under the silicon nitride layer 120. In one embodiment, the silicon nitride layer 120 is etched with a plasma process, e.g., argon (Ar), chlorine ($Cl_2$) or boron trichloride ($BCl_3$) in a pressure at about 30 mTorr. The mask layer 110 then is removed after etching step.

Next with reference to FIG. 2, method 200 continues with operation 206 in which metal features are formed in the two openings in the silicon nitride layer 120 created in the previous step.

Figure 6:
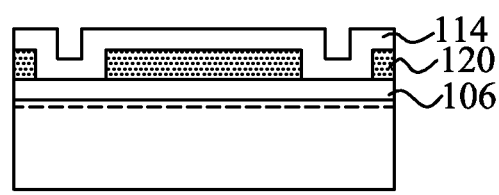

FIGS. 6-10 are cross-sectional views of the structure 100 after the performance of various process steps of operation 206. First, as FIG. 6 shows, a metal layer 114 is deposited over the silicon nitride layer 120 and overfilling the two openings in the silicon nitride layer 120 to expose the top surface of the AlGaN layer 106. The metal layer 114 may include one or more conductive materials. In one example, the metal layer 114 comprises titanium (Ti), titanium nitride (TiN) or aluminum copper (AlCu) alloy. In another example, the metal layer 114 includes a bottom T/TiN layer, an AlCu layer overlying the bottom T/TiN layer, and a top Ti layer overlying the AlCu layer. The bottom T/TiN layer has a thickness in a range between about 100 Å and about 1000 Å. The AlCu layer has a thickness in a range between about 100 Å and about 5000 Å. The top Ti layer has a thickness in a range between about 100 Å and about 1000 Å. The formation methods of the metal layer 114 include ALD or physical vapor deposition (PVD) processes.

Figure 7:
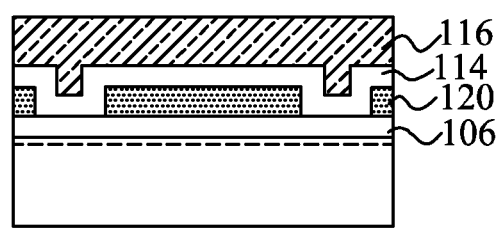
Figure 8:
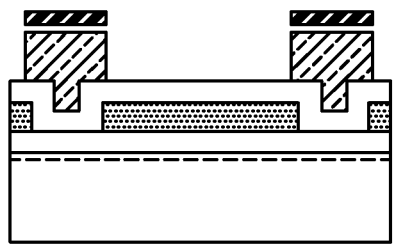
Figure 9:
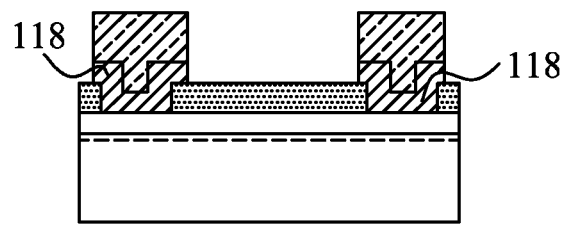

Then, in FIGS. 7-9, a photoresist layer 116 is formed over the metal layer 114 and developed to form a feature over the two openings in the silicon nitride dielectric cap layer 120. After certain portions of the photoresist layer 116 are removed thereby exposing certain portions of the metal layer 114, the exposed portion of the metal layer 114 is then removed by a reactive ion etch (RIE) process that etches the exposed portions of the metal layer 114 down to the underlying silicon nitride insulating layer 120. The photoresist layer is then removed.

As a result, two metal features 118 over the two openings in the silicon nitride insulating layer 120 are generated after the etching process.

Next referring to FIG. 2, method 200 continues with operation 207 in which metal features 118 are annealed to form corresponding intermetallic compounds.

Figure 10:
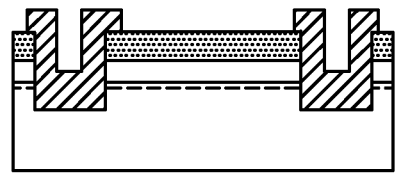

FIG. 10 is a cross-sectional view of the structure 100 after the performance of this annealing operation 207 on the metal features 118. A thermal annealing process may be applied to the metal features 118 such that the metal feature 118, the AlGaN layer 106 and the GaN layer 104 react to form intermetallic compounds 118. The intermetallic compounds 118 are configured as an S/D feature for effective electrical connection to the carrier channel 108. As one example, a rapid thermal annealing (RTA) apparatus and process are utilized for the thermal annealing. The thermal annealing is operated at an annealing temperature in a range between about 750° C. and about 1200° C. Due to the formation of the openings in the AlGaN layer 106, the metal elements in the intermetallic compounds 118 may diffuse deeper into the AlGaN layer 106 and the GaN layer 104. The intermetallic compound 118 may improve electrical connection and form ohmic contacts between the source/drain feature and the carrier channel 108. In one example, the intermetallic compounds 118 are free of Au and comprises Al, Ti, or Cu. In another example, the intermetallic compounds 118 are free of Au and comprises AN, TiN, $Al_3Ti$ or $AlTi_2N$. In one example, the intermetallic compound 118 is formed in the opening of the insulation layer 120 thereby the intermetallic compound 118 has a non-flat top surface. In another example, intermetallic compound 118 overlies a portion of the insulation layer 120. The intermetallic compound 118 has a top width and a bottom width. The top width is wider than the bottom width. In yet another example, intermetallic compound 118 does not overlie a portion of the insulation layer 120. The top width and the bottom width is substantially the same.

Next referring to FIG. 2, method 200 continues with operation 208 in which a gate is formed between the intermetallic compounds.

Figure 11:
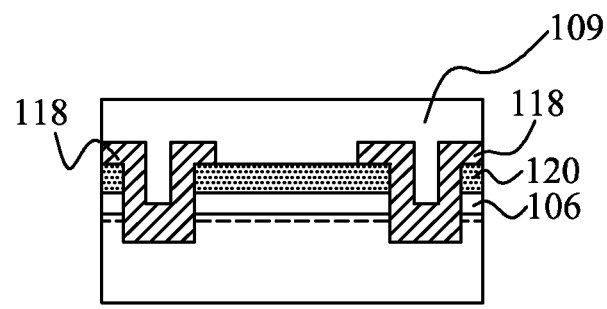

Before the formation of the gate, as shown in FIG. 11, an insulation layer 109 is deposited over the intermetallic compounds 118 and the AlGaN layer 106. This insulation layer 109 is also referred to as a dielectric cap layer. In this embodiment, the insulation layer 109 (or the cap layer) is made of silicon nitride. The dielectric cap layer 109 has a thickness in a range between about 100 Å and about 5000 Å. The dielectric cap layer 109 may include $SiO_2$ or $Si_3N_4$ In one example, the dielectric cap layer 109 is $Si_3N_4$ and formed in a chemical vapor deposition (CVD) method comprising $SiH_4$ and $NH_3$. An operation temperature is in a range of about 650° C. and about 800° C. An operation pressure is in a range of about 0.1 Torr and about 1 Torr. As FIG. 11 shows, a portion of the insulation layer 109 is then removed by photolithographic etching to expose a portion of the silicon nitride insulating layer 120.

Figure 12:
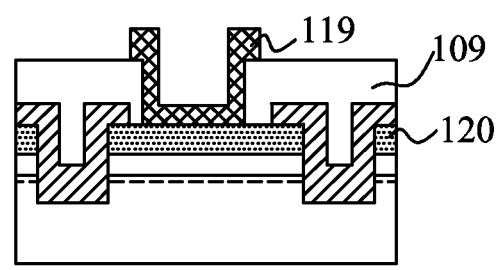

After the performance of operation 208, a gate 119 is formed in FIG. 12. The gate 119 disposed on the silicon nitride insulating layer 120 between the source and drain features. The silicon nitride insulating layer 120 provides isolation to prevent gate leakage and further improve device switching speed.

Various embodiments of the present disclosure may be used to improve a semiconductor structure having a GaN high mobility transistor. For example, the intermetallic compound 118 formed in the openings may improve electrical connection and form ohmic contacts between the source/drain features and the carrier channel 108. The intermetallic compound 118 is free of Au and comprises Al, Ti or Cu. Without using Au in the intermetallic compound 118, the method 200 could also be implemented in the production line of integrated circuits on silicon substrate. The contamination concern from Au on the silicon-fabrication process is eliminated. The intermetallic compound 118, which is free of Au, replaces the transistors with Au in source/drain features. The cost is also reduced.

An embodiment of the disclosure describes a method of forming a semiconductor structure having a substrate. The method includes forming a first layer in contact with the substrate, the first layer made of a first III-V semiconductor material selected from GaN, GaAs and InP. A second layer is formed on the first layer, the second layer made of a second III-V semiconductor material selected from AlGaN, AlGaAs and AlInP, an interface between the first layer and the second layer forming a carrier channel. An insulating layer is formed on the second layer. Portions of the insulating layer and the second layer are removed to expose a top surface of the first layer. A metal feature is formed in contact with the carrier channel and the metal feature is annealed to form a corresponding intermetallic compound.

Another embodiment of the disclosure describes a semiconductor structure having a substrate. The method includes forming a first layer in contact with the substrate, the first layer made of a first III-V semiconductor material. A second layer is formed on the first layer, the second layer made of a second III-V semiconductor material different from the first III-V semiconductor material, an interface between the first layer and the second layer forming a carrier channel. An insulating layer is formed on the second layer. Portions of the insulating layer and the second layer are removed to expose a top surface of the first layer. A metal feature is formed in contact with the carrier channel, wherein the metal feature includes at least one of Al, Ti, and Cu, and the metal feature is annealed to form a corresponding intermetallic compound.

The present disclosure also describes an embodiment of a method of forming a semiconductor structure having a substrate. The method includes forming a first layer in contact with the substrate, the first layer made of a first III-V semiconductor material selected from GaN, GaAs and InP. A second layer is formed on the first layer, the second layer made of a second III-V semiconductor material selected from AlGaN, AlGaAs and AlInP, an interface between the first layer and the second layer forming a carrier channel. An insulating layer is formed on the second layer. Portions of the insulating layer and the second layer are removed to expose a top surface of the first layer. A metal feature is formed in contact with the carrier channel, wherein the metal feature includes at least one of Al, Ti, and Cu, and the metal feature is annealed to form a corresponding intermetallic compound.

Although the embodiments and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present Application, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A method of forming a semiconductor structure having a substrate, the method comprising:
   forming a first layer in contact with the substrate, the first layer made of a first III-V semiconductor material comprising GaN, GaAs or InP;
   forming a second layer on the first layer, the second layer made of a second III-V semiconductor material comprising AlGaN, AlGaAs or AlInP, an interface between the first layer and the second layer forming a carrier channel;
   forming an insulating layer on the second layer;
   removing portions of the insulating layer and the second layer to expose a top surface of the first layer;
   forming a metal feature in contact with the carrier channel; and
   annealing the metal feature to form a corresponding intermetallic compound.

2. The method of claim 1, wherein after annealing the metal feature to form the corresponding intermetallic compound, a gate is formed on the insulating layer.

3. The method of claim 1, wherein silicon implantation is performed in the first layer.

4. The method of claim 1, wherein the first layer is epitaxially grown by metal organic vapor phase epitaxy using a gallium-containing precursor and a nitrogen-containing precursor.

5. The method of claim 1, wherein the second layer is epitaxially grown on the first layer by metal organic vapor phase epitaxy using an aluminum-containing precursor, a gallium-containing precursor, and a nitrogen-containing precursor.

6. The method of claim 1, wherein the removing portions of the insulating layer is a reactive ion etching process.

7. The method of claim 1, wherein after annealing the metal feature to form the corresponding intermetallic compound, a dielectric cap layer is deposited over the intermetallic compound and the insulating layer.

8. The method of claim 1, wherein after annealing the metal feature to form the corresponding intermetallic compound, a gate is formed on the insulating layer.

9. The method of claim 1, wherein the first layer is epitaxially grown by metal organic vapor phase epitaxy using a gallium-containing precursor and a nitrogen-containing precursor.

10. The method of claim 1, wherein the second layer is epitaxially grown on the first layer by metal organic vapor phase epitaxy using an aluminum-containing precursor, a gallium-containing precursor, and a nitrogen-containing precursor.

11. The method of claim 1, wherein after annealing the metal feature to form the corresponding intermetallic compound, a dielectric cap layer is deposited over the intermetallic compound and the insulating layer.

12. The method of claim 1, wherein the intermetallic compound has a top width and a bottom width, and that the top width is larger than the bottom width.

13. A method of forming a semiconductor structure having a substrate, the method comprising:
   forming a first layer in contact with the substrate, the first layer made of a first III-V semiconductor material;
   forming a second layer on the first layer, the second layer made of a second III-V semiconductor material different from the first III-V semiconductor material, an interface between the first layer and the second layer forming a carrier channel;
   forming an insulating layer on the second layer;
   removing portions of the insulating layer and the second layer to expose a top surface of the first layer;
   forming a metal feature in contact with the carrier channel, wherein the metal feature includes at least one of Al, Ti, and Cu; and
   annealing the metal feature to form a corresponding intermetallic compound.

14. The method of claim 13, wherein the metal feature includes at least one of AlN, TiN, $Al_3Ti$ and $AlTi_2N$.

15. The method of claim 13, wherein prior to annealing the metal feature includes a bottom T/TiN layer, an AlCu layer overlying the bottom T/TiN layer, and a top Ti layer overlying the AlCu layer.

16. A method of forming a semiconductor structure having a substrate, the method comprising:
   forming a first layer in contact with the substrate, the first layer made of a first III-V semiconductor material comprising GaN, GaAs or InP;
   forming a second layer on the first layer, the second layer made of a second III-V semiconductor material comprising AlGaN, AlGaAs or AlInP, an interface between the first layer and the second layer forming a carrier channel;
   forming an insulating layer on the second layer;
   removing portions of the insulating layer and the second layer to expose a top surface of the first layer;
   forming a metal feature in contact with the carrier channel, wherein the metal feature includes at least one of Al, Ti, and Cu; and
   annealing the metal feature to form a corresponding intermetallic compound.

17. The method of claim 16, wherein after annealing the metal feature to form the corresponding intermetallic compound, a dielectric cap layer is deposited over the intermetallic compound and the insulating layer.

18. The method of claim 16, wherein the metal feature includes at least one of AlN, TiN, $Al_3Ti$ and $AlTi_2N$.

19. The method of claim 16, wherein prior to annealing the metal feature includes a bottom T/TiN layer, an AlCu layer overlying the bottom T/TiN layer, and a top Ti layer overlying the AlCu layer.

20. The method of claim 16, wherein the intermetallic compound diffuses through the second layer and into the first layer, thereby contacting the carrier channel.

* * * * *